(12) United States Patent
Hiraiwa

(10) Patent No.: US 6,189,339 B1
(45) Date of Patent: Feb. 20, 2001

(54) METHOD FOR PRODUCING SILICA GLASS USED FOR PHOTOLITHOGRAPHY

(75) Inventor: Hiroyuki Hiraiwa, Yokohama (JP)

(73) Assignee: Nikon Corporation, Tokyo (JP)

(*) Notice: Under 35 U.S.C. 154(b), the term of this patent shall be extended for 0 days.

(21) Appl. No.: 08/623,601

(22) Filed: Mar. 28, 1996

(30) Foreign Application Priority Data

Mar. 28, 1995 (JP) .................................................. 7-070165

(51) Int. Cl.⁷ ........................... C03B 19/01; C03B 19/09; C03B 19/06; C03B 11/08
(52) U.S. Cl. .............................. 65/17.3; 65/17.4; 65/17.6; 65/37; 65/39; 65/56; 65/414
(58) Field of Search .................... 65/17.3, 17.4, 65/17.6, 37, 39, 56, 414, 416

(56) References Cited

U.S. PATENT DOCUMENTS

| | | | |
|---|---|---|---|
| 4,497,015 | 1/1985 | Konno et al. | 362/268 |
| 4,666,273 | 5/1987 | Shimizu et al. | 353/101 |
| 5,194,893 | 3/1993 | Nishi | 355/53 |
| 5,236,486 | * 8/1993 | Blankenbecler et al. | 65/61 |
| 5,253,110 | 10/1993 | Ichihara et al. | 359/619 |
| 5,325,230 | * 6/1994 | Yamagata et al. | 359/350 |
| 5,333,035 | 7/1994 | Shiraishi | 355/77 |
| 5,364,433 | * 11/1994 | Nishimura et al. | 65/17.4 |
| 5,365,051 | 11/1994 | Suzuki et al. | 250/201 |
| 5,523,266 | * 6/1996 | Nishimura et al. | 501/54 |

FOREIGN PATENT DOCUMENTS

| | | |
|---|---|---|
| 0 525 984 | 2/1993 | (EP) . |
| 64-24032 | 1/1989 | (JP) . |
| 5-116969 | 5/1993 | (JP) . |
| 6-234531 | 8/1994 | (JP) . |
| 7-187683 | 7/1995 | (JP) . |
| 7-187684 | 7/1995 | (JP) . |
| 7-333407 | 12/1995 | (JP) . |

OTHER PUBLICATIONS

"Japanese Optical Glass Industrial Standards", Appendix: Explanations on Measuring Method of Optical Glass, Japan Optical Glass Manufacturers' Association, (1975) p. 19–23.

* cited by examiner

Primary Examiner—Donald E. Czaja
Assistant Examiner—Jacqueline A. Ruller
(74) Attorney, Agent, or Firm—Foley & Lardner

(57) ABSTRACT

A method for producing a silica glass for photolithography, which comprises the following steps: jetting a starting material gas, an oxygen gas and a hydrogen gas from a burner and depositing and consolidating silica glass powder on a target to form an ingot having a growing direction, where the ingot is grown in such a manner that at least a part of glass synthesis face on the ingot having the silica glass powder deposited and consolidated is a plane substantially perpendicular to the growing direction of the ingot, thereby to obtain the ingot having a portion in which striae are substantially perpendicular to the growing direction of the ingot; and cutting out of the ingot the portion in which the striae are substantially perpendicular to the growing direction of the ingot, thereby to obtain a silica glass having striae which are substantially parallel to each other and are planar.

8 Claims, 10 Drawing Sheets

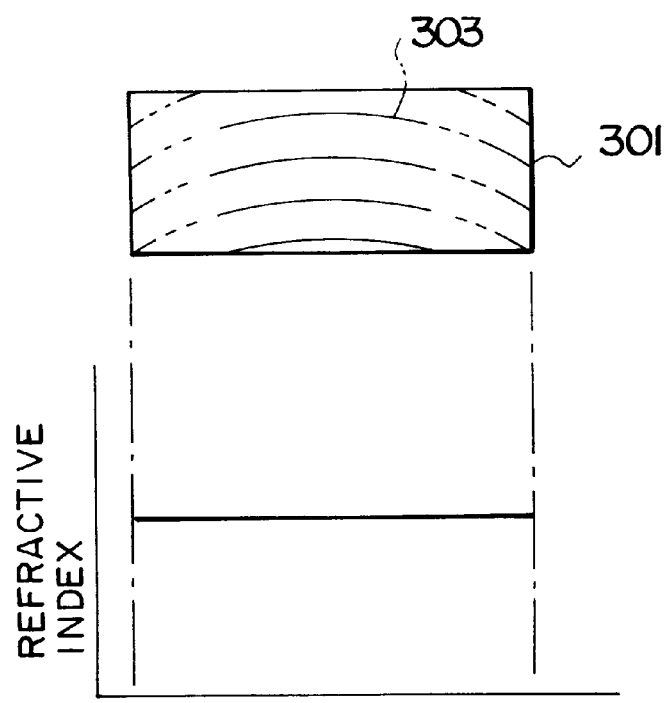
Fig. 3A
Fig. 3B
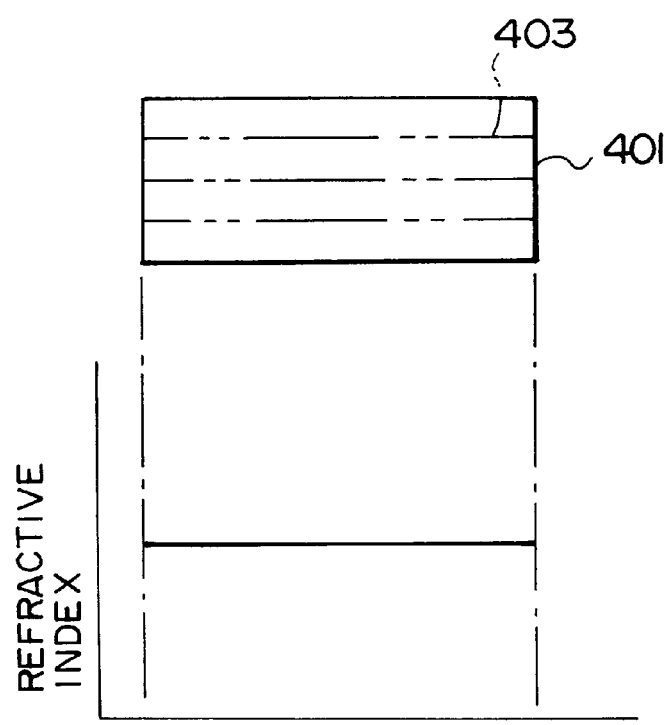
Fig. 4A
Fig. 4B

METHOD FOR PRODUCING SILICA GLASS USED FOR PHOTOLITHOGRAPHY

BACKGROUND OF THE INVENTION

1. Field of the Invention

The present invention relates to a method for producing a synthetic silica glass suitable to be used for optical systems which use a light of a specific wavelength region of 400 nm or shorter, preferably 300 nm or shorter in photolithography, especially ultraviolet lithography technique.

Furthermore, the present invention relates to a synthetic silica glass produced by the above method and optical members such as lenses and mirrors comprising the silica glass.

2. Related Background Art

Recently, VLSI is being further increased in integration density and enhanced in function, and realization of "system-on-chip" comprising a chip implemented with a larger system is increasingly developed in the field of logic VLSI. As a result, fine processing and increase of integration density on wafers such as silicon as a substrate are required. An exposure apparatus called a stepper is used in the photolithography technique in which a fine pattern of integrated circuit is exposed and transferred onto a wafer such as silicon.

For example, taking DRAM as an example among VLSIs, when LSI is developed to VLSI and the capacity is increased in such a way as 1K→256K→1M→4M→16M, the finer stepper of 10 $\mu$m→2 $\mu$m→1 $\mu$m→0.8 $\mu$m→0.5 $\mu$m in width of processed lines is needed.

Therefore, lenses in projection optical system of stepper are required to have a high resolution and a large focal depth. The resolution and focal depth determine depending on wavelength of light used for exposure and N.A. (numerical aperture) of lens.

The angle of diffracted light increases for the finer pattern and unless N.A. of lens is large, the diffracted light cannot be taken in. Further, with the wavelength $\lambda$ of exposure light being shorter, the angle of diffracted light in the same pattern decreases and, thus, N.A. may be small.

Resolution and focal depth are shown by the following formulas.

Resolution=$k1 \cdot \lambda / N.A.$

Focal depth=$k2 \cdot \lambda / N.A.^2$ (wherein k1 and k2 are constants of proportionality)

Accordingly, in order to improve the resolution, N.A. is increased or $\lambda$ is shortened, and, as is clear from the above formula, it is advantageous in respect of the depth to shorten the $\lambda$. From this viewpoint, the wavelength of light source is gradually shortened from g-line (436 nm) to i-line (365 nm) and further to KrF excimer laser (248 nm) or ArF excimer laser (193 nm).

Moreover, the optical system mounted on the stepper comprises combination of optical members such as many lenses and even if decrement of transmittance per one lens is small, it adds up to the total decrement of all the lenses to lead to decrease of luminous power at the irradiated face, and, thus, increase of transmittance is desired for optical members.

Therefore, particularly, in an optical system which uses a light of wavelength region shorter than 400 nm, an optical glass produced by a special method which takes into consideration the decrease of transmittance caused by the combination of shortening of wavelength with optical members is used. Furthermore, in an optical system which uses a light of wavelength region shorter than 300 nm, it has been proposed to use synthetic silica glass or fluoride single crystals such as $CaF_2$ (fluorite).

On the other hand, optical members high in uniformity of refractive index (small in distribution of refractive index in the measured region) are needed as lenses of projection optical systems to realize fine line width and obtain fine and clear exposed and transferred patterns. However, owing to the recent increase of the exposed area with enlargement of wafer size of semiconductors, aperture or thickness of these optical members expands and it becomes further difficult to obtain the required quality.

In order to realize high transmittance for ultraviolet light, it is necessary to reduce the concentration of impurities in silica glass. As a method for producing such silica glass, the flame hydrolysis method is generally employed which comprises jetting from a burner an Si compound gas as a starting material gas, a carrier gas carrying the Si compound gas (e.g., $H_2$ gas or $O_2$ gas) and a combustion gas used for heating and depositing silica glass powder on a target in the flame.

It is known that according to this method, since the concentration of impurities in the starting material gas and the combustion gas can be easily held down, a high purity silica glass can be obtained, but the silica glass to be used as optical members for ultraviolet lithography is also required to have a uniform refractive index distribution. The main causes for the refractive index distribution of the silica glass becoming ununiform are fluctuations of various conditions occurring in synthesis of the silica glass, such as change of temperature distribution at the synthesis face due to the flame, flame hydrolysis reaction or thermal decomposition and thermal oxidation reactions, change of diffusion state of impurities into the glass, and the like.

Under the circumstances, Japanese Patent Application Laid-Open Gazette No. Hei. 6-234531 (234531/94) discloses a method for making uniform the refractive index distribution of silica glass. According to this method, a temperature distribution at which the uniformity of the refractive index is optimized is formed at a head portion of an ingot by relatively moving the burner and the ingot in accordance with the temperature distribution at the head portion, thereby to attain the uniform refractive index distribution.

However, when the synthetic silica glass obtained by such a conventional method is used, there is a limit in improvement of resolution and this is still not satisfactory.

SUMMARY OF THE INVENTION

The inventors have conducted intensive research on influence of striae in the synthetic silica glass exerted on optical performance. They have found that even when striae are present, if they are in the form of plane or straight line included in a plane substantially perpendicular to the optical axis when used as an optical member, a high resolution can be obtained without causing deterioration of optical performance. The present invention is based on this findings.

An object of the present invention is to provide a method for producing a synthetic silica glass for photolithography which does not undergo deterioration in optical performance caused by the presence of striae and can attain a high resolution.

Another object of the present invention is to provide a synthetic silica glass and an optical member for photolithography which does not undergo deterioration of optical performance caused by the presence of striae and can attain a high resolution, and an exposure apparatus which attain a-high resolution.

A first method for producing the silica glass for photolithography according to the present invention comprises the following steps:

jetting a starting material gas, an oxygen gas and a hydrogen gas from a burner and depositing and consolidating silica glass powder on a target to form an ingot having a grawing direction, where the ingot is grown in such a manner that at least a part of glass synthesis face on the ingot formed by depositing and consolidating the silica glass powder is a plane substantially perpendicular to the growing direction of the ingot, thereby to obtain the ingot having a portion in which the striae are substantially perpendicular to the growing direction of the ingot; and cutting out of the ingot the portion in which the striae are planes substantially perpendicular to the growing direction of the ingot, thereby to obtain a silica glass having striae which are substantially parallel to each other and are planar.

A second method for producing the silica glass for photolithography according to the present invention comprises the following steps:

jetting a starting material gas, an oxygen gas and a hydrogen gas from a burner and depositing and consolidating silica glass powder on a target to form an ingot having a growing direction;

observing striae of the ingot;

cutting out of the ingot a silica glass plate having a first face along the striae of the ingot and a second face opposing the first face and along the striae of the ingot; and heating the silica glass plate to a temperature higher than the softening point of the silica glass and pressing it to deform the silica glass plate so that the striae become planes substantially perpendicular to the growing direction of the ingot, thereby to obtain a silica glass having striae which are substantially parallel to each other and are planar.

Furthermore, the silica glass for photolithography according to the present invention is obtained by the above first or second method and has planar striae which are substantially parallel to each other and have a curvature of 1 mm or less for 10 mm of width.

Moreover, the optical member for photolithography according to the present invention comprises a silica glass obtained by the above first or second method and has planar striae which are substantially parallel to each other and have a curvature of 1 mm or less for 10 mm of width.

Furthermore, the present invention provides the following exposure apparatus.

An exposure apparatus which comprises:

a stage allowing a photosensitive substrate to be held on a main surface thereof;

an illumination optical system for emitting exposure light of a predetermined wavelength and transferring a predetermined pattern of a mask onto said substrate;

a projection optical system provided between a surface on which the mask is disposed and said substrate, for projecting an image of the pattern of said mask onto said substrate; and an optical member comprising a synthetic silica glass which is produced by the above-mentioned method of the present invention.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 3A and 3B are a drawing and a graph which show distribution of refractive index in the silica glass having striae in the form of curved face.

FIGS. 4A and 4B are a drawing and a graph which show distribution of refractive index in the silica glass having planar striae in the form of planar face.

DESCRIPTION OF THE PREFERRED EMBODIMENTS

The first method for producing a silica glass for photolithography according to the present invention will be explained.

According to the first method of the present invention, first a starting material gas, an oxygen gas and a hydrogen gas are jetted from a burner to deposit silica glass powder on a target and consolidating the powder to form an ingot. This is a method called a direct method among flame hydrolysis methods and this method comprises depositing silica glass powder in the flame on the glass synthesis face (head portion) of the ingot formed on the target and simultaneously consolidating the deposited silica glass powder, thereby to grow the ingot.

Figure 1A:
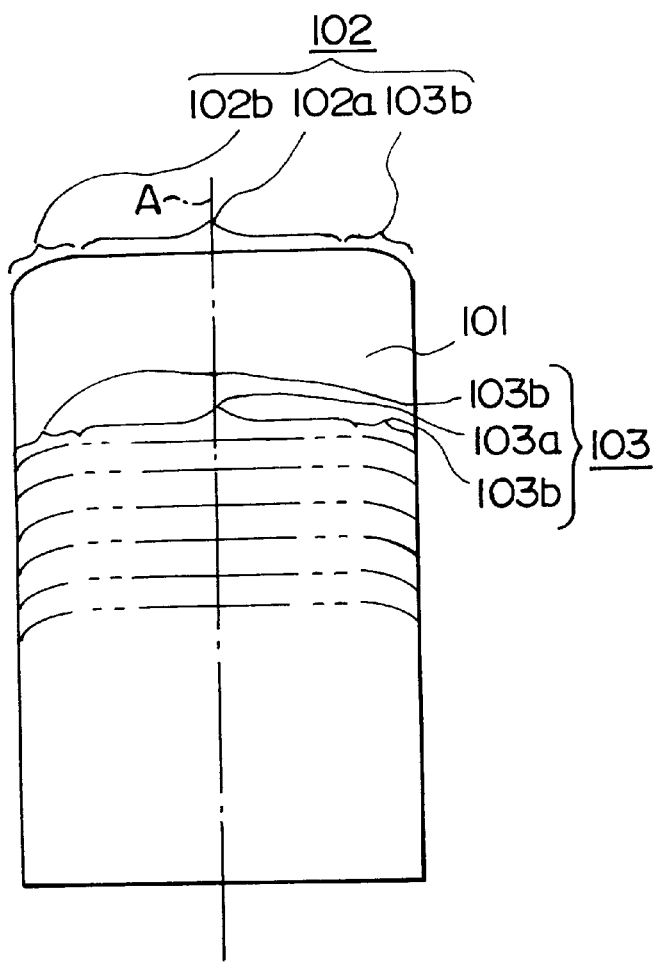
FIGS. 1A to 1C are diagrams which show the steps of the first method for producing a silica glass according to the present invention.

In the first production method of the present invention, the ingot must be grown with at least a part of the glass synthesis face of the ingot being a plane substantially perpendicular to the growing direction of the ingot. That is, as shown in FIG. 1A, ingot 101 according to the first production method of the present invention has the glass synthesis face (head portion) 102a which always forms a plane substantially perpendicular to the growing direction A (one point chain line) of the ingot. The thus grown ingot 101 has striae 103a (two point chain line: shown in only a part of the ingot) which are planes sustantially perpendicular to the growing direction A of the ingot as shown in FIG. 1A.

The area of the portion 102a which is a plane substantially perpendicular to the growing direction A of the ingot is preferably at least 50%, most preferably at least 70%, of the total area of the glass synthesis face 102 (planar portion 102a and curved face portion 102b) of the ingot 101. In the course of growing of the ingot, one portion which has been the planar portion 102a becomes a portion having striae 103a which are planes substantially perpendicular to the growing direction A of the ingot, while another portion which has been the curved face portion 102b becomes a portion having curved striae 103b. Therefore, the proportion of the planar portion 102a in the glass synthesis face is preferably as large as possible.

Furthermore, the planar portion 102a in the glass synthesis face preferably has a curvature of 0.5 mm or less for a width of 10 mm, whereby each of the planar portions 103a of the striae has, as a result, a curvature of 1 mm or less for the width of 10 mm.

Such striae are streak-like or lamellar optically ununiform portions present in a synthetic silica glass. It is considered that they are produced by the disorder of the net work structure of OH group and $SiO_2$ caused by the fluctuation of temperatures during the production.

Figure 2A:
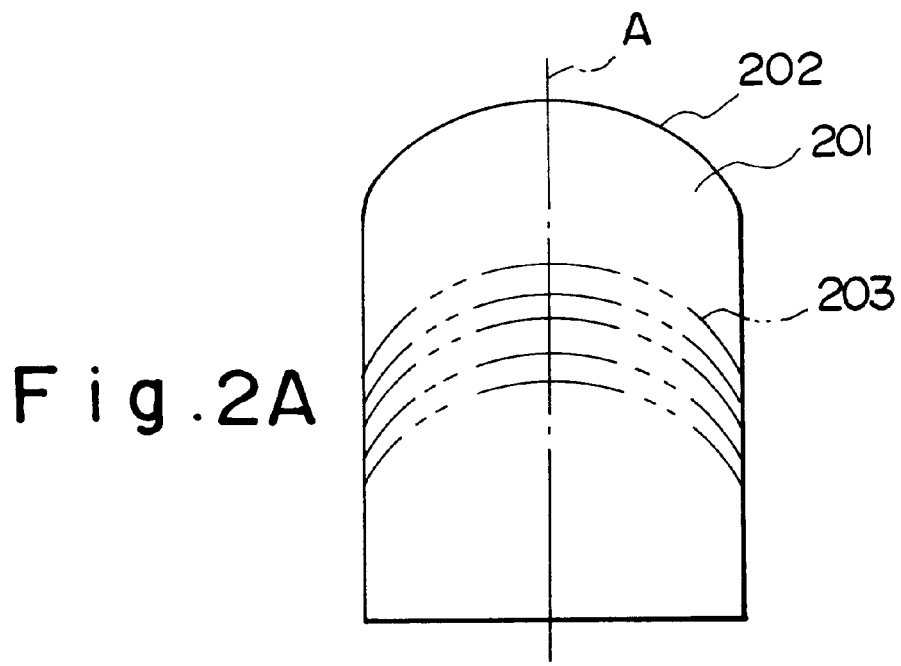
FIGS. 2A to 2D are diagrams which show the steps of the second method for producing a silica glass according to the present invention.

Even when a temperature distribution which optimizes the uniformity of refractive index is formed at the glass synthesis face (head portion) as disclosed in Japanese Patent Application Laid-Open Gazette No. Hei. 6-234531 (234531/94), the glass synthesis face 202 on the ingot 201 becomes convex to the growing direction A of the ingot and the striae 203 of the ingot 201 also become convex as shown in FIG. 2A. The conventional silica glass block 301 cut out from such ingot 201 has curved striae 303 as shown in FIG. 3A. On the other hand, the silica glass block 401 of the present invention cut out from the ingot 101 having the planar striae 103a has the planar striae 403 as shown in FIG. 4A. Since refractive index for light is affected by the number of striae through which the light cross, both the silica glass block 301 having the curved striae 303 shown in FIG. 3A and the silica glass block 401 having the planar striae 303 shown in FIG. 4A are uniform in the refractive index distribution because the number of striae through which the light cross are the same (FIG. 3B and FIG. 4B).

However, as mentioned hereinafter, the inventors have found that since the resolution is affected by the shape of the striae, the silica glass block 401 of the present invention shown in FIG. 4A is improved in the resolution than the conventional silica glass block 301 shown in FIG. 3A.

That is, if the striae are in the planar or straight line form which are included in a plane perpendicular to the optical axis, a high resolution can be obtained without deteriorating the optical performance. The reason therefor is considered as follows. Light having various angles enter into a lens. When such light pass through layers differing in refractive index, such as striae, the light which enter into the lens at an angle nearly perpendicular to the striae has the smallest influence on the resolution. On the other hand, with the striae and the light being in parallel to each other, the light pass through a layer of a long distance and the adverse effect on the resolution increases. Accordingly, the silica glass of the present invention in which all the striae are perpendicular to the light differs in resolution from the conventional silica glass in which the striae are not perpendicular to the light.

Moreover, intense striae have a great effect on the resolution. If the striae can be quantitatively obtained as a refractive index distribution, an optical simulation becomes possible, but the measurement is difficult (considered to be a difference in refractive index in the order of $10^{-7}$ to $10^{-5}$). Therefore, lenses differing in intensity of striae were actually produced and an optical system was constituted including each of the lenses, and optical performance was evaluated. As a result, it was confirmed that the striae up to the standard sample B (grade B or the second grade) specified by Standard 11 of Japan Optical Glass Industrial Association did not reduce the optical performance and gave a high resolution.

Measurement of the striae is conducted, for example, in accordance with the method for measuring the striae of optical glasses of Standard 11 of Japan Optical glass Industrial Association. That is, the measurement is conducted by visually comparing a sample of 50×50×20 mm, both sides (50×20 mm) being abraded in parallel with a standard sample. According to this method, even the weak striae can be measured as compared with a method which measures the striae as birefringence through a polarization plate utilizing the strain of the portions of striae.

The shape of the striae is due to the method of synthesis of silica glass. In the flame hydrolysis method, the fluctuations of various conditions in synthesis change with time, whereby silica glasses differing in optical properties are deposited with forming curved laminae on the synthesis face. Therefore, the distribution of striae has a regularity, but various shapes of the striae are obtained depending on the cutting direction when the synthesized ingot is cut for making optical members.

It is considered that the distribution of striae of synthetic silica glass obtained by the flame hydrolysis method depends on the depositing rate (feed amount of starting materials, exhaust velocity, thermal efficiency, etc.) and the temperature of the synthesis face which may determine the shape of the ingot synthesis face. These are reflected in the shape of the synthesis face of the ingot. Therefore, a synthetic silica glass block in which the striae distribution is planar (in the form of straight line) along the two parallel faces of the block can be obtained by making planar the shape of the glass synthesis face of the ingot to make the striae distribution planar and by cutting at a plane horizontal therewith. That is, at the time of depositing silica glass powder on the target, the planar portion of the glass synthesis face has a refractive index distribution horizontal to the plane and, accordingly, the striae are also formed in the form of plane.

Figure 5:
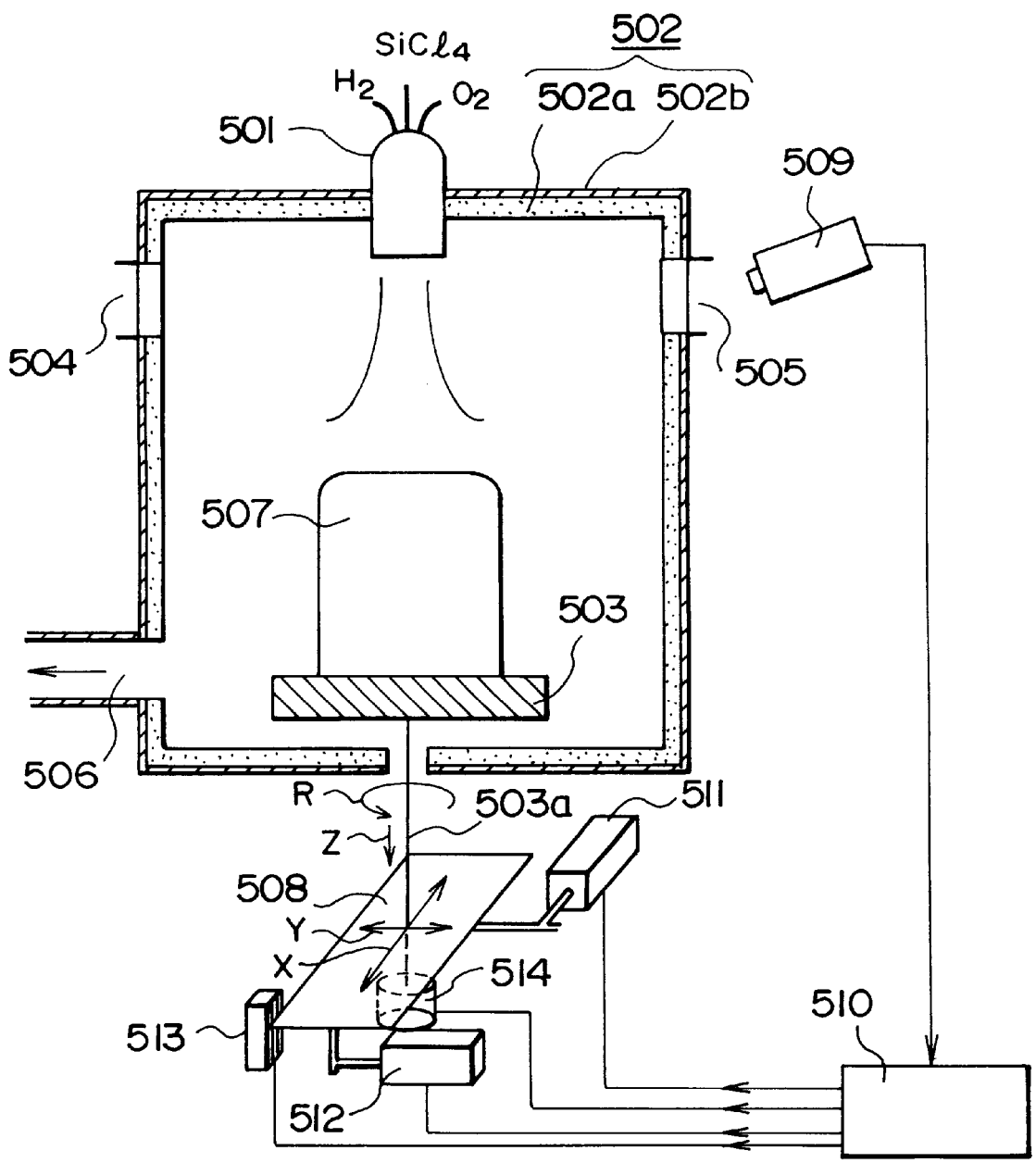
FIG. 5 is a schematic view of an apparatus for producing silica glass useful for the present invention.

An apparatus and conditions effective for growing the ingot with the shape of at least a part of the glass synthesis face being planar will be explained hereinbelow. FIG. 5 is a schematic view of an apparatus for producing a synthetic silica glass useful for the present invention. Burner 501 is provided so that the tip thereof is directed toward target 503 from the upper portion of oven frame 502 comprising refractory layer 502a and heat insulating layer 502b. Window 504 for observation by an operator and window 505 for observation by IR camera and exhaust vent 506 are provided at the oven frame 502. Furthermore, target 503 for forming ingot 507 is provided in the lower portion of the oven frame 502 and is connected to XY stage 508 through supporting shaft 503a.

Figure 6:
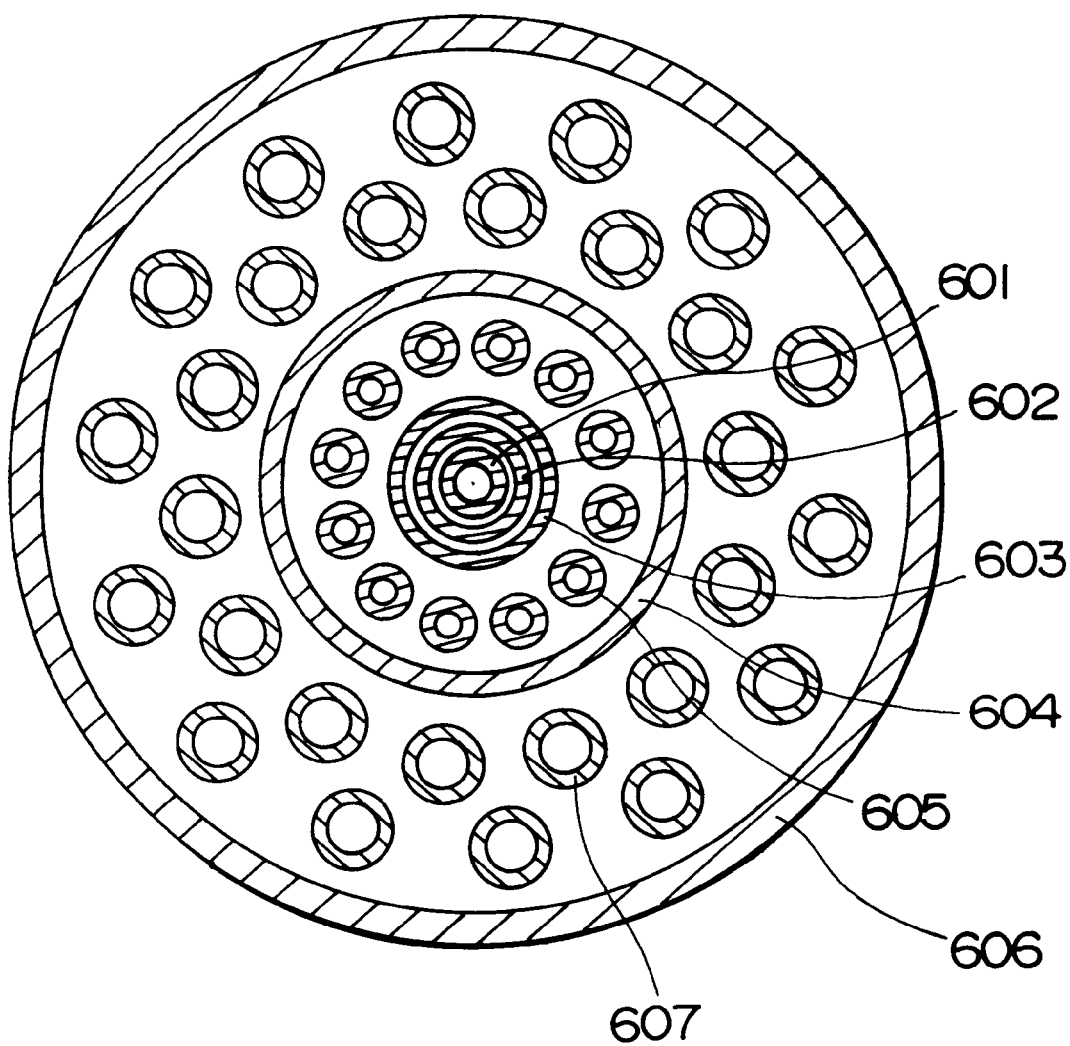
FIG. 6 is a front view of a tip of a burner useful for the present invention.

FIG. 6 is a front view of the tip of the burner 501 especially useful for the present invention. The burner 501 is provided with a first tube 601 which is arranged at the center portion and which is for jetting a starting material gas (such as $SiCl_4$ gas), a second tube 602 which is arranged concentrically around the first tube 601 and which is for jetting an oxygen gas (or a hydrogen gas), a third tube 603 which is arranged concentrically around the second tube 602 and which is for jetting a hydrogen gas (or a oxygen gas), a fourth tube 604 which is arranged concentrically around the third tube 603 and which is for jetting a hydrogen gas, a plurality of fifth tubes 605 which are arranged between the outer surface of the third tube 603 and the inner surface of the fourth tube 604 and which are for jetting an oxygen gas, a sixth tube 606 which is arranged concentrically around the fourth tube 604 and which is for jetting a hydrogen gas and a plurality of seventh tubes 607 which are arranged between the outer surface of the fourth tube 604 and the inner surface of the sixth tube 606 and which are for jetting an oxygen gas. The above tubes are all silica glass tubes. This burner 501 is a novel burner developed especially for the present invention.

In order to grow the ingot with the shape of at least a part of the glass synthesis face being planar, it is preferred that the flow velocity of the hydrogen gas jetted from the fourth tube 604 and that of the oxygen gas jetted from the fifth tube 605 are smaller (most preferably 1/1.1–1/4) than the flow velocity of the hydrogen gas jetted from the third tube 603 (or the second tube 602) and that of the oxygen gas jetted from the second tube 602 (or the third tube 603), respectively. Further, it is preferred that the flow velocity of the hydrogen gas jetted from the sixth tube 606 and that of the oxygen gas jetted from the seventh tubes 607 are smaller (more preferably 1/8–1/4 and most preferably 1/8–1/6) than the flow velocity of the hydrogen gas jetted from the fourth tube 604 and that of the oxygen gas jetted from the fifth tubes 605, respectively. By increasing the flow velocity of gas at the central part of the burner and decreasing the flow velocity at peripheral part of the burner as above, the capture of the silica glass powder by the target is dispersed and the glass synthesis face of the ingot tends to become flatter.

Furthermore, it is preferred that the molar ratio of the oxygen gas jetted from the second tube 602 (or the third tube 603) to the hydrogen gas jetted from the third tube 603 (or the second tube 602) is 0.1–0.4 and the molar ratio of the oxygen gas jetted from the fifth tubes 605 to the hydrogen gas jetted from the fourth tube 604 and the molar ratio of the oxygen gas jetted from the seventh tubes 607 to the hydrogen gas jetted from the sixth tube 606 are 0.4–0.5, respectively. The complete combustion theoretical ratio of oxygen/hydrogen (molar ratio) is 0.5, and when the above molar ratio at the central part of the burner is within the above range, the concentrated heating of the central part does not occur and the glass synthesis face of the ingot tends to become flatter. The flow rate of each gas is optionally selected depending upon the scale of the oven and the like.

The starting material gas is oxidized by the flame produced by the hydrogen gas and the oxygen gas to become a fused silica (silica glass powder), which is deposited on the target 503 and consolidated to form ingot 507. The head portion (glass synthesis portion) of the ingot 507 is covered with flame and the shape and the temperature is observed by IR camera 509. Computer 510 for data processing of images is connected to the IR camera 509, and to the computer 510 are connected X axis servo motor 511, Y axis servo motor 512 and Z axis linear guide 513 which drive XY stage 508 in the directions of X axis, Y axis and Z axis, and rotating motor 514 which rotates the target 503 in the direction of R. Based on the processed image data and/or instructions from operator, the computer 510 controls the XY stage 508 by sending signals to the servo motors and the like so that the glass synthesis face of the ingot becomes a plane.

Specifically, it is preferred that target 503 and ingot 507 formed thereon are rocked (oscillated) in the direction of X axis which is substantially perpendicular to the growing direction of the ingot and rocked (oscillated) in the direction of Y axis which is substantially perpendicular to the growing direction of the ingot and the direction of the X axis to uniformly jet the various gases to the glass synthesis face of the ingot 507, and, with rotating the target and the ingot formed thereon around an ingot central axis parallel to the growing direction of the ingot, the ingot 507 is gradually left from the burner 501 so that the distance between the tip of the burner 501 and the glass synthesis face of the inglot 507 is kept constant. In this way, by uniformly jetting the various gases against the entire surface of the glass synthesis face, the glass synthesis face of the ingot tends to become flatter.

Figure 7:
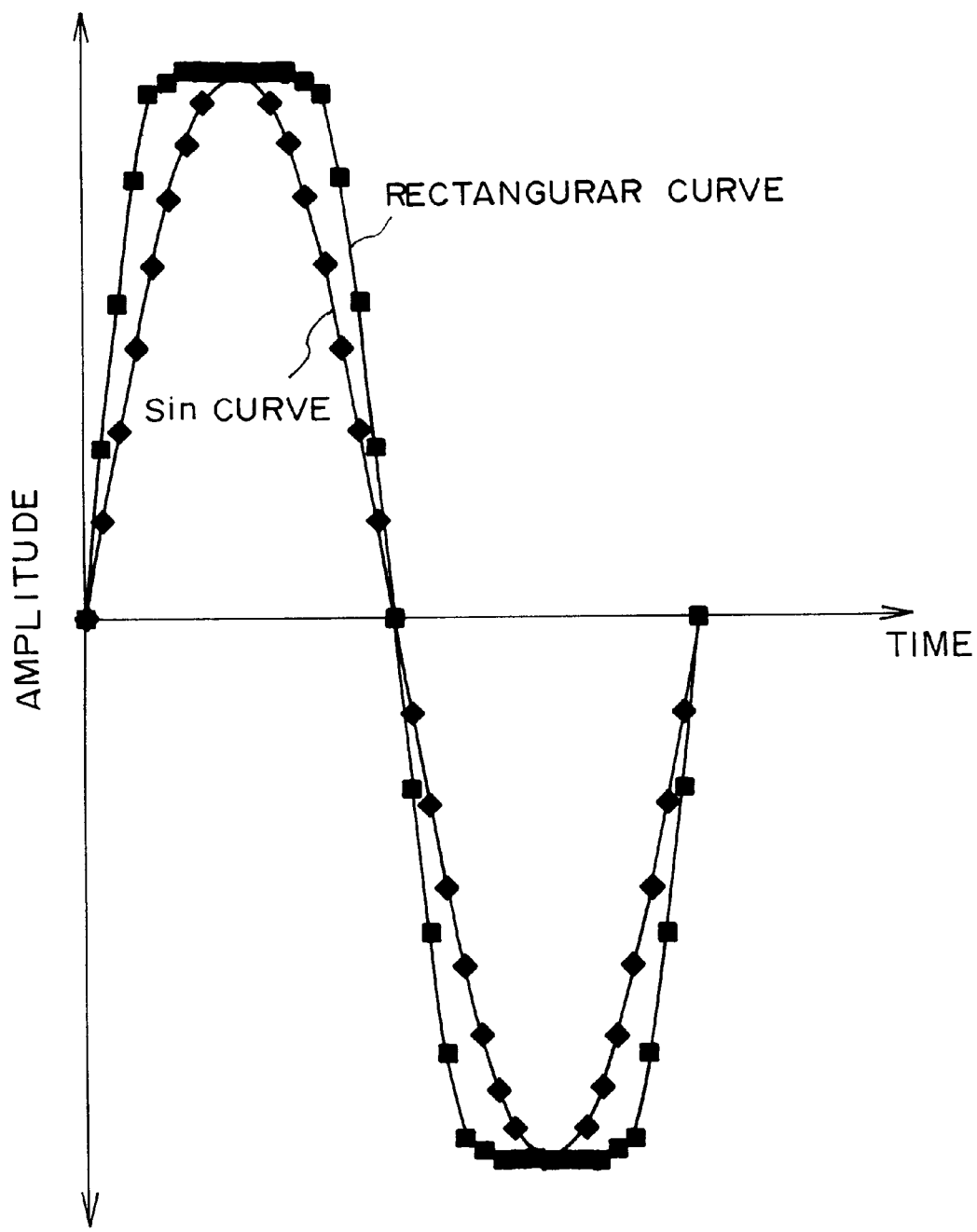
FIG. 7 is a graph which shows moving pattern of XY stage of the target.

As more specific rocking pattern, the rocking pattern in the direction of X axis is preferably in the form of Sin curve or rectangular curve as shown in FIG. 7 and the rectangular curve is most preferred. Moreover, it is preferred to offset to the direction of Y axis so that the intersection point of X axis and Y axis is distant 3–50 mm from the ingot central axis parallel to the growing direction of the ingot 507. If the offset value is less than 3 mm, the central portion of the glass synthesis face tends to dent and if it is more than 50 mm, the shape of the ingot cannot be maintained. The period and amplitude of the curves is optionally selected depending on the size of the desired ingot. Moreover, when the rotating speed of the target 503 is higher, the striae are apt to become flatter, but when it is too high, the silica glass powder becomes difficult to be deposited on the target 503 and, thus, 5–20 rpm is preferred.

The exhaust amount from the exhaust port 506 is preferably increased for more flattening the striae. That is, when the glass synthesis face becomes planar, the shape retention of the ingot tends to become difficult (readily ruptured). Therefore, it is preferred to increase the exhaust amount to increase the amount of the outside air introduced from the opening at the lower part of the furnace, whereby the outer periphery of the ingot is cooled to prevent the rupture of the ingot.

Figure 1B:
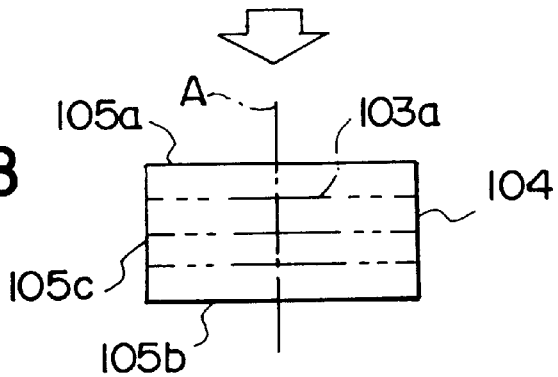

In the first method of the present invention, the portion of the ingot in which the striae 103*a* are planes substantially perpendicular to the growing direction A of the ingot as shown in FIG. 1B is cut out from the ingot to obtain a silica glass (silica glass block) 104 of the present invention. In this case, it is preferred that both the upper face (the first face) 105*a* of the silica glass 104 and the lower face (the second face) 105*b* opposing the upper face are planes along the striae 103*a* of the ingot. The shape of the side face (the third face) 105*c* of the silica glass 104 is unlimited, but preferably the silica glass 104 is in the form of column formed by removing the portion 103*b* from the ingot 101 because the ingot 101 is usually columnar and normally includes on periphery the portion 103*b* where the striae are curved. The cutting method is unlimited and usual cutting, abrading, etc. are employed.

The thus obtained silica glass 104 of the present invention has the striae 103*a* which are substantially parallel to each other and are planar, and the curvature of the striae 103*a* is preferably 1 mm or less for the width of 10 mm. By using the silica glass 104 of the present invention, it becomes possible to attain such a state that all of the striae 103*a* are perpendicular to the incident light L (optical axis in the optical system to which the glass is applied) and, thus, a high resolution can be attained without deterioration of optical performance.

Next, the second method for producing the silica glass for photolithography according to the present invention will be explained referring to the drawings.

First, a starting material gas, an oxygen gas and a hydrogen gas are jetted from a burner to deposit and consolidate silica glass powder on a target to form an ingot having a growing direction. This method is called direct method among the flame hydrolysis methods and comprises depositing and simultanesouly consolidating silica glass powder in the flame on the glass synthesis face (head portion) of the ingot formed on the target, thereby growing the ingot. However, in the second method of the present invention, it is not needed to grow the ingot in such a manner that the glass synthesis face becoming a plane, and, as shown in FIG. 2A, the glass synthesis face 202 of ingot 201 in the second method may be in the form of convex against the ingot growing direction A as in the ingot produced by conventional methods. Therefore, the thus grown ingot 201 has striae 203 (two-point chain line: showning only a part of the ingot) which are convex against the ingot growing direction A as shown in FIG. 2A.

The apparatus used for producing such an ingot may be known one as disclosed in, for example, Japanese Patent Application Laid-Open Gazette No. Hei. 6-234531 (234531/94) and the conditions may be the same as in the conventional methods.

Next, in the second method of the present invention, the striae 203 of the thus obtained ingot 201 are observed. The observing method may be such one as capable of specifying the striae 203 so that a silica glass plate can be cut out along the striae 203 at the step mentioned hereinafter. For example, a method of observation explained below which uses the apparatus shown in FIG. 8 can be suitably employed.

This method is a qualitative way to observe striae in glass. The light source 801 is a high power mercury-arc lamp whose output is sent through a collimator 802 followed by a condensor lens 803 which provides a uniform, diverging light 804. The sample 805 is set up between the light source 801 and a viewing screen 806 on a rotatable chuck 807, and the shadow pattern created by light 804 passing through the glass 805 is observed on the viewing screen 806. Note that the sample 805 is oriented such that the light 804 is travelling parallel to the striae. The presence of striae occurs as thin, parallel lines on the viewing screen 806. Striae are most distinct when aligned exactly along the striae, since slight angular rotation of the test piece 805 renders the striae invisible.

The shadowgram is an effective method of gaining quick, qualitative results on a fused silica sample. An advantage of the shadowgram is that the entire surface of the block may be observed at one time. Observations of the striae with this method indicate that the striae are parallel, periodic, and planar. The shadowgram method has been used as a qualitative specification by comparison of test pieces to limit samples. By comparison of limit samples, the qualifying parameter has been contrast of brightness between striae with the target being no striae observable on the viewing screen. However, comparison of limit samples is quite subjective, and therefore, the technique is not desirable as a measurement tool.

Crude estimates of the striae spacing may be obtained by placing a reticle of known size at the location of the test piece and noting its relative size on the observation screen. The striae spacing may then be estimated by the calculated magnification for the object-to-screen distance. The shadowgram method reveals nothing quantitative about the magnitude of refractive index variation which causes the appearance of striae.

Next, in the second method of the present invention, a silica glass plate is cut out from the ingot 203 along the striae 203 observed at the above step to obtain silica glass plate 203 having an upper face (the first face) 205a along the striae 203 and a lower face (the second face) 205b opposing the upper face and along the striae 203. The thus obtained silica glass plate 204 is a curved plate having the first convex face 205a and the second concave face 205b which are along the striae 203 and the curvature of the striae is usually more than 1 mm for the width of 10 mm. The shape of the side face (the third face) 205c of the silica glass plate 204 is unlimited, but since the ingot 201 is columnar, the silica glass plate 204 cut out is preferably also in the form of curved column. The cutting method is not limitative and usual cutting method, abrading method (curve generating process), etc. can be employed.

Subsequently, in the second method of the present invention, the silica glass plate 204 obtained in the above step is heated to a temperature higher than the softening point of the silica glass and then pressed to deform the silica glass plate 204 so that the striae 203 become planes substantially perpendicular to the ingot growing direction A.

Figure 9:
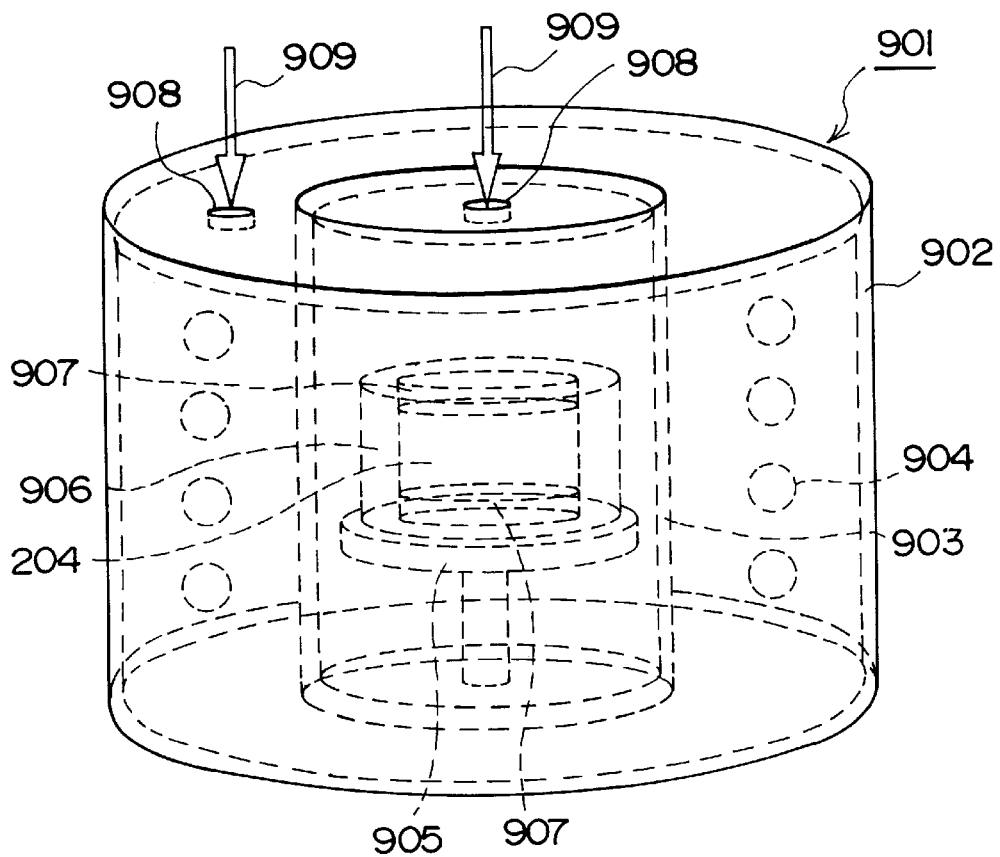
FIG. 9 is an oblique view of a heat treating apparatus useful for the present invention.

Apparatuses and conditions effective to heat and deform the silica glass plate 204 will be explained. FIG. 9 is an oblique view of a heat treating apparatus useful in the present invention. The heat treating apparatus 901 shown in FIG. 9 is an atmospheric heating furnace (muffle furnace) of double structure, which is composed of furnace wall 902, muffle (outer mold) 903, heating element 904 provided between the furnace wall 902 and the muffle 903, stand 905 placed in the muffle 903, and matrix 906 mounted on the stand 905. The matrix 906 preferably comprises a silica glass block made of sol-gel synthetic silica powder. The silica glass plate 204 provided with $SiO_2$ plates 907 on the upper and lower faces is placed in the matrix 906 and subjected to heating and pressing in an inert gas atmosphere introduced from gas inlet 908 and at a given temperature and under a given pressure. The heat treating apparatus may be the heating furnace disclosed in Japanese Patent Application Laid-Open Gazette No. Hei. 5-116969 (116969/93).

As for the heating and pressing conditions, the atmosphere is preferably an inert gas atmosphere, most preferably a nitrogen atmosphere. Further, the pressure is preferably 2–9 $kg/cm^2$, the retention temperature is preferably 1800–1950° C. and the retention time is preferably 2–4 hr. In cases the silica glass plate 204 is subjected to the heating and pressing treatment under the above conditions, the silica glass plate 204 tends to be deformed satisfactorily and be fully prevented from the glass vaporization and the devitrification. Further, the temperature-raising rate from a room temperature to the retention temperature is preferably 200–300° C./hr for easily maintaining the pressure in the furnace. Moreover, the temperature-lowering rate from the retention temperature to a first intermediate temperature in the range of 1100–1200° C. is preferably 50° C./hr or higher for preventing the devitrification, and the temperature-lowering rate from the first intermediate temperature to a second intermediate temperature of 500° C. or lower is preferably 10–20° C./hr for removal of strain and maintaining the uniformity.

The thus obtained silica glass 206 of the present invention has striae 203a which are substantially parallel to each other and are planar, and the curvature of the striae 203a is preferably 1 mm or less for the width of 10 mm. Since the distribution of striae in the synthetic silica glass obtained in this way by the flame hydrolysis method is regular, a synthetic silica glass having planar or straight line striae can be obtained by cutting out a synthetic glass having a curved shape in conformity with the shape of striae and heat treating the glass to make it planar. When the silica glass 206 of the present invention is used, it becomes possible to attain such a state that all of the striae 203*a* are perpendicular to the incident light L (optical axis of the optical system used) and, thus, a high resolution can be attained without causing deterioration of optical performance.

Next, the optical members of the present invention for photolithography will be explained.

Figure 1C:
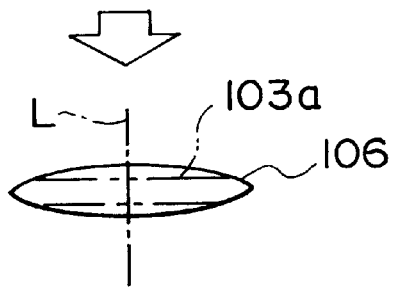

The optical members of the present invention comprise the synthetic silica glass which is obtained by the first or second method of the present invention and which has planar striae, said striae being substantially parallel to each other and having a carvature of 1 mm or less for the width of 10 mm. These optical members of the present invention has no limitation except that they contain the above synthetic silica glass and include various optical members used in photolithography, especially ultraviolet lithography technique, such as lenses and prisms for exposure apparatuses. FIG. 1C and FIG. 2D illustrate optical lenses 106 and 207 as examples of the optical members of the present invention. The optical members of the present invention include blanks. The method for processing the silica glass of the present invention into the optical members of the present invention has no limitation and usual cutting method, abrading method, etc. can be employed.

When the optical members of the present invention are used, it becomes possible to attain such a state that all of the striae 203*a* are perpendicular to the incident light L (optical axis of the optical system used) and, thus, a high resolution can be attained without causing deterioration of optical performance.

Next, an exposure apparatus of the present invention will be explained.

The present invention is preferably applied to the projection exposure apparatus, such as a so-called stepper, for projecting an image of patterns of reticle onto a wafer coated with a photoresist.

Figure 10:
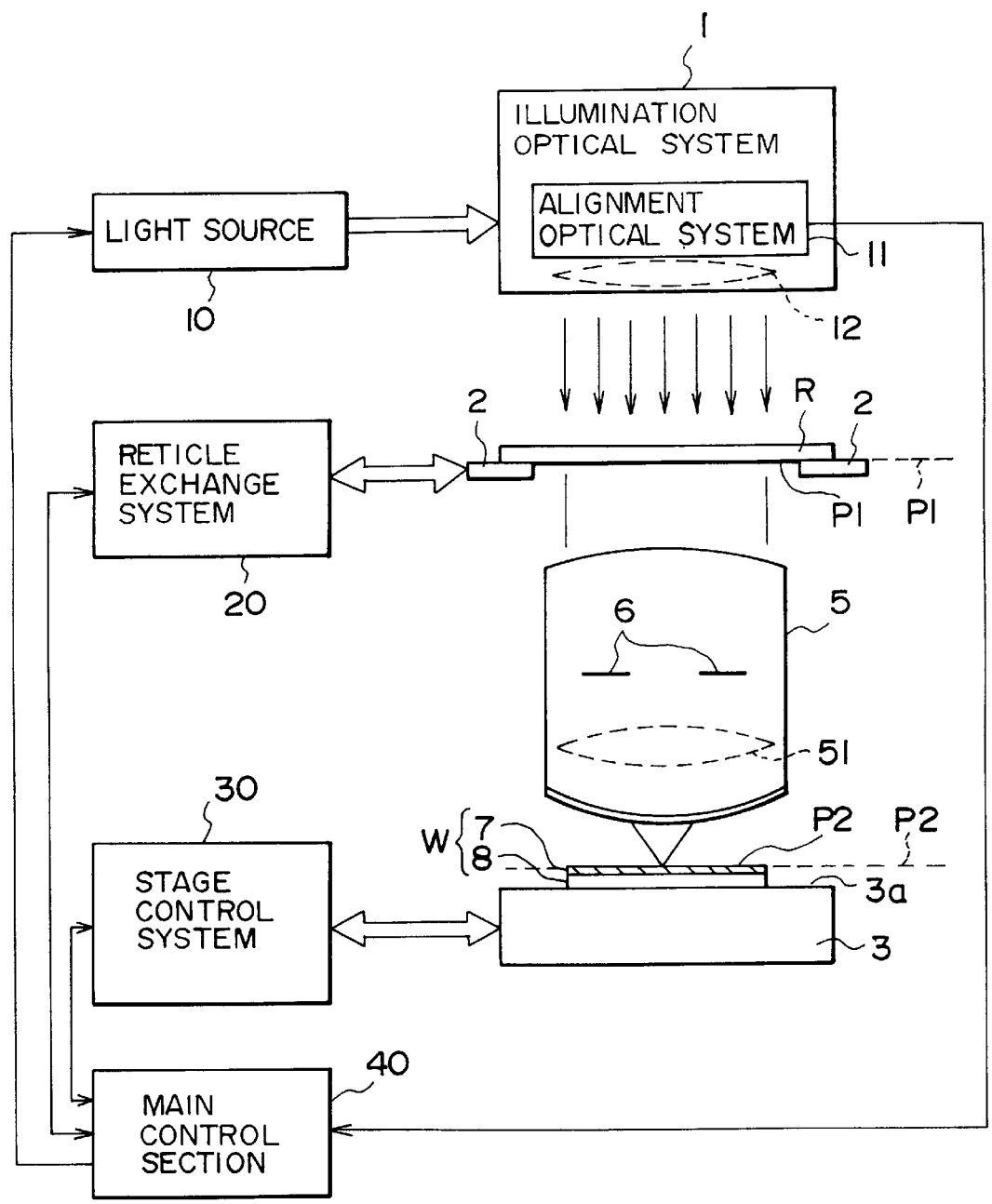
FIG. 10 is a diagram showing a basic construction of one example of the exposure apparatus of the present invention.

FIG. 10 shows a basic structure of the exposure apparatus according to the present invention. As shown in FIG. 10, an exposure apparatus of the present invention comprises at least a wafer stage 3 allowing a photosensitive substrate W to be held on a main surface 3*a* thereof, an illumination optical system 1 for emitting exposure light of a predetermined wavelength and transferring a predetermined pattern of a mask (reticle R) onto the substrate W, a light source 10 for supplying the exposure light to the illumination optical system 1, a projection optical system (preferably a catadioptric one) 5 provided between a first surface P1 (object plane) on which the mask R is disposed and a second surface P2 (image plane) to which a surface of the substrate W is corresponded, for projecting an image of the pattern of the mask R onto the substrate W. The illumination optical system 1 includes an alignment optical system 11 for adjusting a relative positions between the mask R and the wafer W, and the mask R is disposed on a reticle stage 2 which is movable in parallel with respect to the main surface of the wafer stage 3. A reticle exchange system 20 conveys and changes a reticle (mask R) to be set on the reticle stage 2. The reticle exchange system 20 includes a stage driver for moving the reticle stage 2 in parallel with respect to the main surface 3*a* of the wafer stage 3. The projection optical system 5 has a space permitting an aperture stop 6 to be set therein. The sensitive substrate W comprises a wafer 8 such as a silicon wafer or a glass plate, etc., and a photosensitive material 7 such as a photoresist or the like coating a surface of the wafer 8. The wafer stage 3 is moved in parallel with respect to a object plane P1 by a stage control system 30. Further, since a main control section 40 such as a computer system controls the light source 10 the reticle exchange system 20, the stage control system 30 or the like, the exposure apparatus can perform a harmonious action as a whole.

The exposure apparatus of the present invention is provided with the optical members (such as optical lenses made of the following synthetic silica glass) comprising the synthetic silica glass which is obtained by the first or second method of the present invention and which has planar striae, said planar striae being substantially parallel to each other and having a carvature of 1 mm or less against the width of 10 mm. Specifically, the exposure apparatus of the present invention shown in FIG. 10 can be provided with the optical lenses of the present invention as the optical lens (lenses) 12 of the illumination optical system 1 and/or the optical lens (lenses) 51 of the projection optical system 5.

According to the exposure apparatus of the present invention, it becomes possible to attain such a state that all of the striae are perpendicular to the incident light (optical axis) to be incident thereon and, thus, a high resolution can be attained without causing deterioration of optical performance.

The techniques relating to an exposure apparatus of the present invention are described, for example, in U.S. patent application Ser. Nos. 255,927, 260,398, 299,305, U.S. Pat. Nos. 4,497,015, 4,666,273, 5,194,893, 5,253,110, 5,333, 035, 5,365,051, 5,379,091, or the like. The reference of U.S. patent application Ser. No. 255,927 teaches an illumination optical system (using a laser source) applied to a scan type exposure apparatus. The reference of U.S. patent application Ser. No. 260,398 teaches an illumination optical system (using a lamp source) applied to a scan type exposure apparatus. The reference of U.S. patent application Ser. No. 299,305 teaches an alignment optical system applied to a scan type exposure apparatus. The reference of U.S. Pat. No. 4,497,015 teaches an illumination optical system (using a lamp source) applied to a scan type exposure apparatus. The reference of U.S. Pat. No. 4,666,273 teaches a step-and-repeat type exposure apparatus capable of using the catadioptric projection optical system of the present invention. The reference of U.S. Pat. No. 5,194,893 teaches an illumination optical system, an illumination region, mask-side and reticle-side interferometers, a focusing optical system, alignment optical system, or the like. The reference of U.S. Pat. No. 5,253,110 teaches an illumination optical system (using a laser source) applied to a step-and-repeat type exposure apparatus. The '110 reference can be applied to a scan type exposure apparatus. The reference of U.S. Pat. No. 5,333, 035 teaches an application of an illumination optical system applied to an exposure apparatus. The reference of U.S. Pat. No. 5,365,051 teaches a auto-focusing system applied to an exposure apparatus. The reference of U.S. Pat. No. 5,379, 091 teaches an illumination optical system (using a laser source) applied to a scan type exposure apparatus. These documents are hereby incorporated by reference.

The present invention is explained specifically by the following examples.

EXAMPLE 1

A columnar ingot of 250 mm in diameter was prepared under the following conditions using the apparatus for producing synthetic silica glass shown in FIG. 5 provided with the burner shown in FIG. 6.

(Starting materials)

Starting material gas (silicon tetrachloride gas (69 vol. %)+hydrogen carrier gas (31 vol. %))→the first tube.

Oxygen gas→The third, fifth and seventh tubes.

Hydrogen gas→The second, fourth and sixth tubes.

(Size of tube and flow rate of gas)

| NO. | Outer diameter (mm) | Inner diameter (mm) | Space (mm) | Thickness of tube (mm) | The number | Flow rate (slm) | Flow rate (G/M) | Flow velocity (M/S) |
|---|---|---|---|---|---|---|---|---|
| The first tube | 5.9 | 3.5 | | 1.2 | 1 | 1.8 | 30.0 | 10.4 |
| The second tube | 10.1 | 7.5 | 0.8 | 1.3 | 1 | 75.0 | | 74.3 |
| The third tube | 13.9 | 11.5 | 0.7 | 1.2 | 1 | 22.0 | | 15.4 |
| The fifth tube | 4.9 | 2.5 | | 1.2 | 12 | 66.0 | | 18.7 |
| The fourth tube | 35.5 | 31.5 | | 2.0 | 1 | 150.0 | | 11.8 |
| The seventh tube | 6.9 | 4.5 | | 1.2 | 28 | 110.0 | | 4.1 |
| The sixth tube | 70.5 | 64.5 | | 3.0 | 1 | 250.0 | | 2.9 |

(Behavior of the target)

Rocking pattern in the direction of X axis: Rectangular curve shown in FIG. 7 (Period: 90 seconds, amplitude: 100 mm).

Offsetting in the direction of Y axis: 10 mm

Pull down rate in the direction of Z axis: 2.4 mm/hr

Rotation rate: 7 rpm (Exhaust amount)

2.5 m$^3$/min

Figure 11:
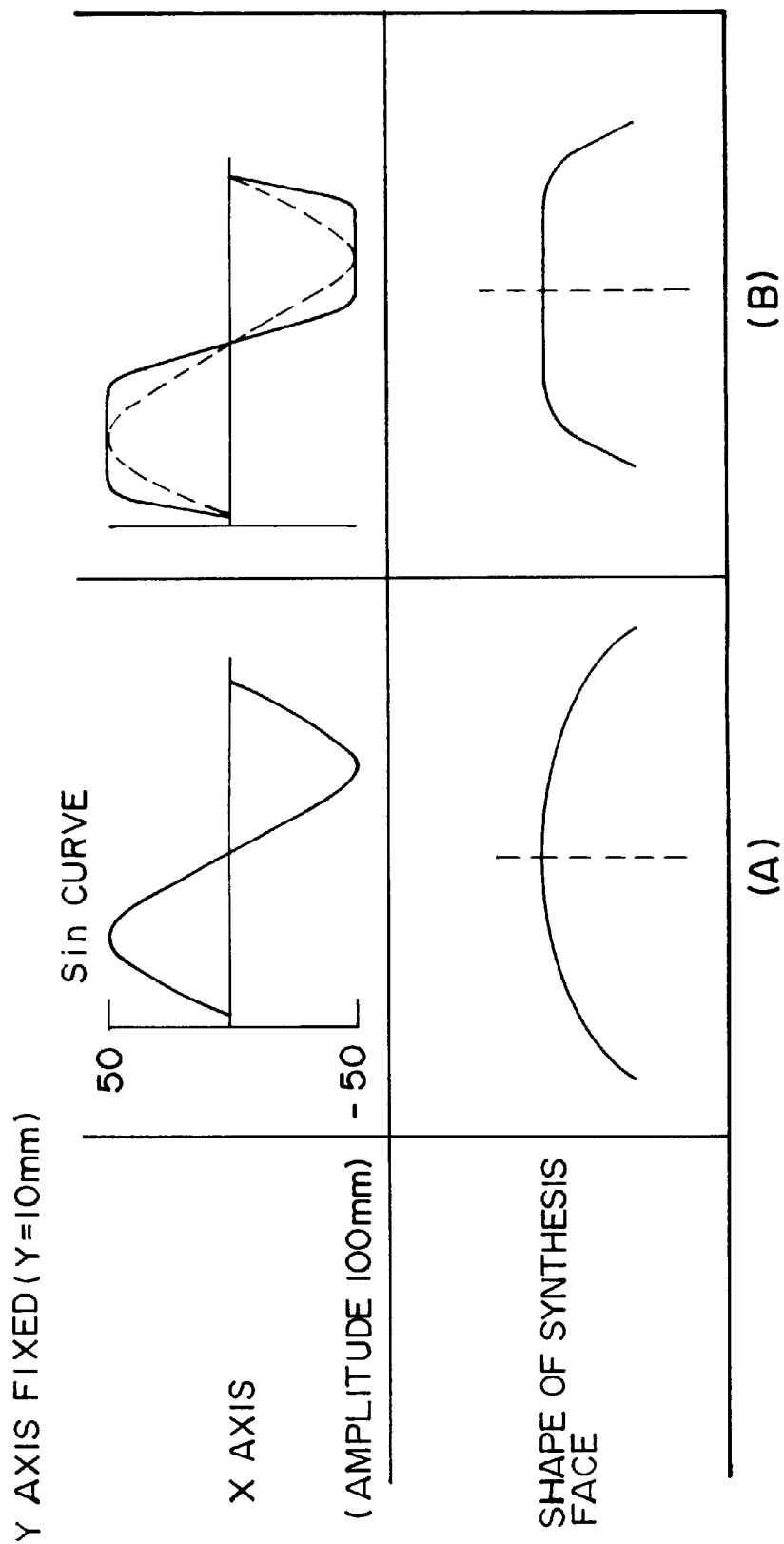
FIG. 11 is a graph which shows moving pattern of XY stage of the target.

The shape of the silica glass synthesis face in the growing of the ingot was monitored to find that the head portion was planar (as shown in column (B) of FIG. 11) which is a plane substantially perpendicular to the growing direction of the ingot, and that the curvature (deviation from plane) of the synthesis face of the ingot was kept at 0.5 mm/10 mm or less.

A measuring sample of 50×50×20 mm was prepared from the resulting ingot in accordance with the method for the measurement of striae of optical glass specified in Standard 11 of Japan Optical Glass Industry Association. However, both sides of 50×20 mm subjected to parallel abrading were kept horizontal to the synthesis face of the ingot. The resulting sample and standard samples were visually compared to find no striae in the measuring direction.

Further, a sample having parallel abraded surfaces perpendicular to the synthesis face of the ingot was prepared and measurement was conducted on striae in the same manner as above. As a result, the regularity of distribution of striae was not in the form of curved face (curved line), but in the form of a plane (straight line) perpendicular to the abraded surface, and the curvature (deviation from plane) of the striae (plane/line) was 1 mm/10 mm or less.

Then, in the manner as shown in FIG. 1A to FIG. 1C, optical lenses were prepared from the above ingot so that the lens central axis (L) was perpendicular to the striae, and the exposure apparatus (KrF stepper) shown in FIG. 10 was constructed using the resulting optical lenses as projection optical system lenses, and a pattern was printed by means of this exposure apparatus under the following conditions. As a result, a critical resolution of an extremely high level of 0.20 μm was attained.

(Evaluation conditions)

Energy density: About 1 mJ/cm$^2$ pulse (on the resist)

Frequency: 500 Hz

Resist: Resist for evaluation

EXAMPLE 2

A columnar ingot of 250 mm in diameter was prepared in the same manner as in Example 1, except that a burner having the tube size shown in the following table was used, the gas flow rate of each tube was as shown in the following table and the rocking pattern in the direction of X axis was Sin curve shown in FIG. 7 (one period: 90 seconds, amplitude: 100 mm).

(Size of tube and flow rate of gas)

| NO. | Outer diameter (mm) | Inner diameter (mm) | Space (mm) | Thickness of tube (mm) | The number | Flow rate (slm) | Flow rate (G/M) | Flow velocity (M/S) |
|---|---|---|---|---|---|---|---|---|
| The first tube | 5.9 | 3.5 | | 1.2 | 1 | 1.8 | 30.0 | 10.4 |
| The second tube | 10.1 | 7.5 | 0.8 | 1.3 | 1 | 75.0 | | 74.3 |
| The third tube | 13.9 | 11.5 | 0.7 | 1.2 | 1 | 22.0 | | 15.4 |
| The fifth tube | 4.9 | 2.5 | | 1.2 | 12 | 77.0 | | 21.8 |
| The fourth tube | 35.5 | 31.5 | | 2.0 | 1 | 175.0 | | 13.7 |
| The seventh tube | 6.9 | 4.5 | | 1.2 | 28 | 77.0 | | 2.9 |
| The sixth tube | 70.5 | 64.5 | | 3.0 | 1 | 175.0 | | 2.0 |

The shape of the silica glass synthesis face in the growing of the ingot was monitored to find that the head portion was planar (as shown in column (B) of FIG. 11) which is a plane substantially perpendicular to the growing direction of the ingot, and that the curvature (deviation from plane) of the synthesis face of the ingot was kept at 0.5 mm/10 mm or less.

A sample was prepared from the resulting ingot in the same manner as in Example 1 to find that the resulting sample had the same striae as of the sample obtained in Example 1, the regularity of distribution of striae was not in the form of curved face (curved line), but in the form of a plane (straight line) perpendicular to the abraded surface, and the curvature (deviation from plane) of the striae (plane/line) was 1 mm/10 mm or less.

Then, in the same manner as in Example 1, optical lenses were prepared from the above ingot, the exposure apparatus (KrF stepper) shown in FIG. 10 was constructed using the resulting optical lenses, and a pattern was printed by the use of it to attain the critical resolution of an extremely high level of 0.20 μm.

EXAMPLE 3

A columnar ingot of 250 mm in diameter was prepared in the same manner as in Example 1, except that the following starting materials were used, and the kind of gas jetted from each tube and the gas flow rate of each tube were as shown in the following table.

(Starting materials)

Starting material gas (silicon tetrachloride gas (69 vol. %)+oxygen carrier gas (31 vol. %))→the first tube.
Oxygen gas→The second, fifth and seventh tubes.
Hydrogen gas→The third, fourth and sixth tubes.
(Size of tube and flow rate of gas)

| NO. | Outer diameter (mm) | Inner diameter (mm) | Space (mm) | Thickness of tube (mm) | The number | Flow rate (slm) | Flow rate (G/M) | Flow velocity (M/S) |
|---|---|---|---|---|---|---|---|---|
| The first tube | 5.9 | 3.5 | | 1.2 | 1 | 1.8 | 30.0 | 10.4 |
| The second tube | 10.1 | 7.5 | 0.8 | 1.3 | 1 | 20.0 | | 19.8 |
| The third tube | 13.9 | 11.5 | 0.7 | 1.2 | 1 | 100.0 | | 70.2 |
| The fifth tube | 4.9 | 2.5 | | 1.2 | 12 | 66.0 | | 18.7 |
| The fourth tube | 35.5 | 31.5 | | 2.0 | 1 | 150.0 | | 11.8 |
| The seventh tube | 6.9 | 4.5 | | 1.2 | 28 | 110.0 | | 4.1 |
| The sixth tube | 70.5 | 64.5 | | 3.0 | 1 | 250.0 | | 2.9 |

The shape of the silica glass synthesis face in the growing of the ingot was monitored to find that the head portion was planar (as shown in column (B) of FIG. 11) which is a plane substantially perpendicular to the growing direction of the ingot, and that the curvature (deviation from plane) of the synthesis face of the ingot was kept at 0.5 mm/10 mm or less.

A sample was prepared from the resulting ingot in the same manner as in Example 1 to find that the resulting sample had the same striae as of the sample obtained in Example 1, the regularity of distribution of striae was not in the form of curved face (curved line), but in the form of a plane (straight line) perpendicular to the abraded surface, and the curvature (deviation from plane) of the striae (plane/line) was 1 mm/10 mm or less.

Then, in the same manner as in Example 1, optical lenses were prepared from the above ingot, the exposure apparatus (KrF stepper) shown in FIG. 10 was constructed using the resulting optical lenses, and a pattern was printed by the use of it to attain the critical resolution of an extremely high level of 0.20 μm.

EXAMPLE 4

A columnar ingot of 250 mm in diameter was prepared in the same manner as in Example 2, except that the following starting materials were used, and the kind of gas jetted from each tube and the gas flow rate of each tube were as shown in the following table.

(Starting materials)

Starting material gas (silicon tetrachloride gas (69 vol. %)+oxygen carrier gas (31 vol. %))→the first tube.
Oxygen gas→The second, fifth and seventh tubes.
Hydrogen gas→The third, fourth and sixth tubes.
(Size of tube and flow rate of gas)

| NO. | Outer diameter (mm) | Inner diameter (mm) | Space (mm) | Thickness of tube (mm) | The number | Flow rate (slm) | Flow rate (G/M) | Flow velocity (M/S) |
|---|---|---|---|---|---|---|---|---|
| The first tube | 5.9 | 3.5 | | 1.2 | 1 | 1.8 | 30.0 | 10.4 |
| The second tube | 10.1 | 7.5 | 0.8 | 1.3 | 1 | 20.0 | | 19.8 |
| The third tube | 13.9 | 11.5 | 0.7 | 1.2 | 1 | 100.0 | | 70.2 |
| The fifth tube | 4.9 | 2.5 | | 1.2 | 12 | 77.0 | | 21.8 |
| The fourth tube | 35.5 | 31.5 | | 2.0 | 1 | 175.0 | | 13.7 |
| The seventh tube | 6.9 | 4.5 | | 1.2 | 28 | 77.0 | | 2.9 |
| The sixth tube | 70.5 | 64.5 | | 3.0 | 1 | 175.0 | | 2.0 |

The shape of the silica glass synthesis face in the growing of the ingot was monitored to find that the head portion was planar (as shown in column (B) of FIG. 11) which is a plane substantially perpendicular to the growing direction of the ingot, and that the curvature (deviation from plane) of the synthesis face of the ingot was kept at 0.5 mm/10 mm or less.

A sample was prepared from the resulting ingot in the same manner as in Example 1 to find that the resulting sample had the same striae as of the sample obtained in Example 1, the regularity of distribution of striae was not in the form of curved face (curved line), but in the form of a plane (straight line) perpendicular to the abraded surface, and the curvature (deviation from plane) of the striae (plane/line) was 1 mm/10 mm or less.

Then, in the same manner as in Example 1, optical lenses were prepared from the above ingot, the exposure apparatus (KrF stepper) shown in FIG. 10 was constructed using the resulting optical lenses, and a pattern was printed by the use of it to attain the critical resolution of an extremely high level of 0.20 μm.

Comparative Example 1

Figure 12:
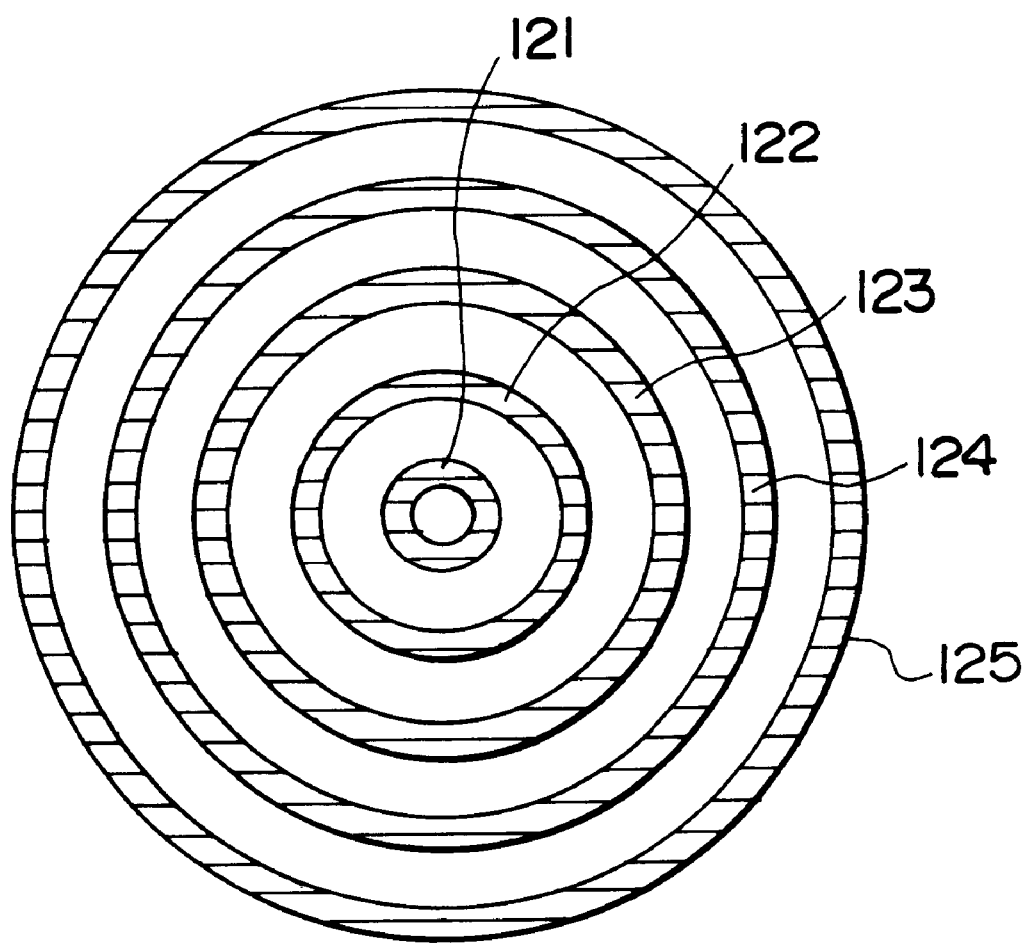
FIG. 12 is a front view of a tip of a conventional burner usable also for the present invention.

A columnar ingot of 180 mm in diameter was prepared in the same manner as in Example 1, except that a conventional quituple burner shown in FIG. 12 (having the first ring 121, the second ring 122, the third ring 123, the fourth ring 124 and the fifth ring 125) was used, the following starting materials were used, the kind of gas jetted from each ring and the gas flow rate in each ring were as shown in the following table, the rocking pattern in the direction of X axis was Sin curve shown in FIG. 7 (one period: 90 seconds, amplitude: 100 mm), and the exhaust amount was 2 m³/min.

(Starting materials)

Starting material gas (silicon tetrachloride gas (60 vol. %)+oxygen carrier gas (40 vol. %))→the first ring.

Oxygen gas→The second and fourth rings.
Hydrogen gas→The third and fifth rings.
(Size of ring and flow rate of gas)

| NO. | Outer diameter (mm) | Inner diameter (mm) | Space (mm) | Thickness of tube (mm) | The number | Flow rate (slm) | Flow rate (G/M) | Flow velocity (M/S) |
|---|---|---|---|---|---|---|---|---|
| The first ring | 5.9 | 3.5 | | 1.2 | 1 | 1.8 | 20 | 8.0 |
| The second ring | 17.5 | 14 | 4.05 | 1.3 | 1 | 70 | | 9.2 |
| The third ring | 35.5 | 31.5 | 7 | 1.2 | 1 | 130 | | 4.0 |
| The fourth ring | 45 | 41 | 2.75 | 1.5 | 1 | 170 | | 8.6 |
| The fifth ring | 60 | 54 | 4.5 | 1.5 | 1 | 330 | | 7.9 |

The shape of the silica glass synthesis face in the growing of the ingot was monitored to find that the head portion was dented as shown in column (A) of FIG. 11 and the curvature (deviation from plane) of the synthesis face of the ingot was about 5 mm/10 mm.

A sample was prepared from the resulting ingot in the same manner as in Example 1 to find that the regularity of distribution of striae was in the form of curved face (convex) and the curvature (deviation from plane) of the striae (plane/line) was about 5 mm/10 mm.

Then, in the same manner as in Example 1, optical lenses were prepared from the above ingot, the exposure apparatus (KrF stepper) shown in FIG. 10 was constructed using the resulting optical lenses, and a pattern was printed. The critical resolution was 0.35 μm which was insufficient.

Comparative Example 2

A columnar ingot of 230 mm in diameter was prepared in the same manner as in Example 1, except that the target was not rocked in the direction of X axis and the exhaust amount was 2 m³/min.

The shape of the silica glass synthesis face in the growing of the ingot was monitored to find that the head portion was dented as shown in column (A) of FIG. 11 and the curvature (deviation from plane) of the synthesis face of the ingot was about 5 mm/10 mm.

A sample was prepared from the resulting ingot in the same manner as in Example 1 to find that the regularity of distribution of striae of the resulting sample was in the form of curved face (convex) and the curvature (deviation from plane) of the striae (plane/line) was about 5 mm/10 mm.

Then, in the same manner as in Example 1, optical lenses were prepared from the above ingot, the exposure apparatus (KrF stepper) shown in FIG. 10 was constructed using the resulting optical lenses, and a pattern was printed by the use of it. The critical resolution was 0.32 μm which was insufficient.

EXAMPLE 5

Figure 2B:
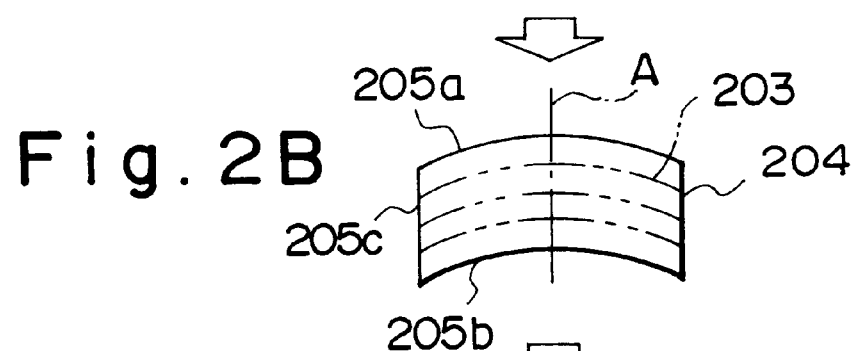
Figure 8:
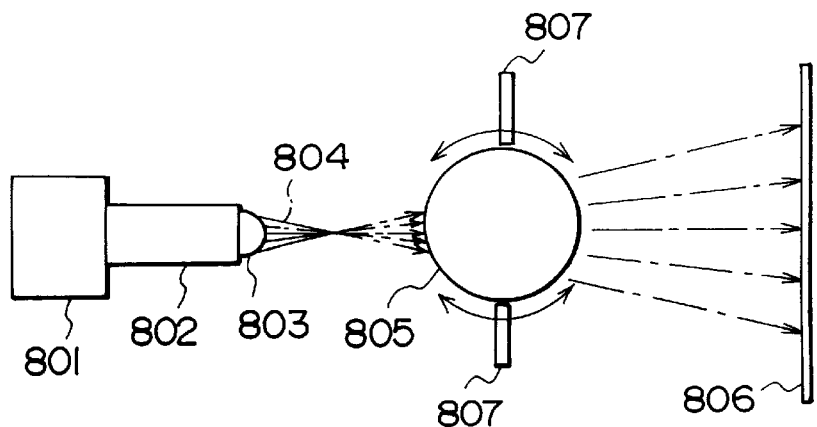
FIG. 8 is a schematic view of an apparatus for observing striae useful for the present invention.

The striae of the ingot obtained in Comparative Example 1 were observed using the apparatus shown in FIG. 8, and, then, a curved plate having convex face and concave face along the striae was cut out from the above ingot as shown in FIG. 2A to FIG. 2B.

Then, the curved plate was placed in the heat treating apparatus shown in FIG. 9 and subjected to heating and pressing treatments under the following conditions.

Figure 2C:
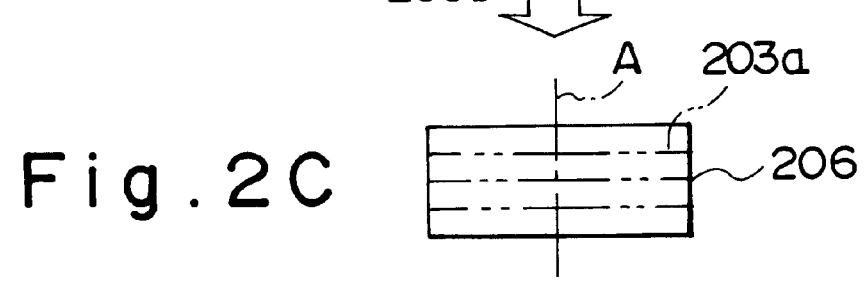
Figure 2D:
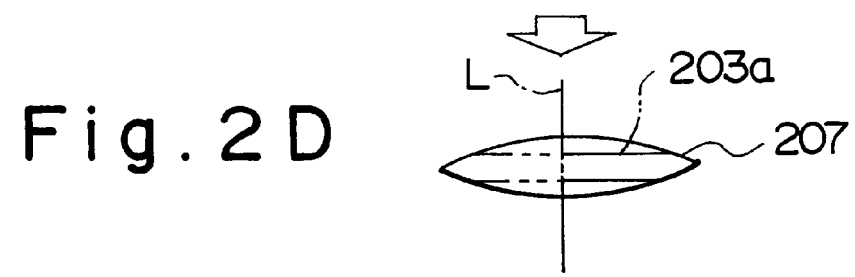

(Heat treating conditions)
$N_2$ atmosphere
Pressure: 5.0 kg/cm²
Temperature-raising rate: 200° C./hr
Retention temperature: 1900° C.
Retention time: 2 hr
Temperature-lowering rate (1900–1100° C.): 50° C./hr
Temperature-lowering rate (1100–500° C.): 10° C./hr The regularity of distribution of striae in the resulting silica glass plate was not in the form of curved face (curved line), but in the form of a plane (straight line) perpendicular to the abraded surface as shown in FIG. 2C, and the curvature (deviation from plane) of the striae (plane/line) was 1 mm/10 mm or less.

Then, in the same manner as in Example 1, optical lenses were prepared from the above ingot, the exposure apparatus (KrF stepper) shown in FIG. 10 was constructed using the resulting optical lenses, and a pattern was printed by the use of it to attain the critical resolution of an extremely high level of 0.20 μm.

Comparative Example 3

A measuring sample of 50×50×20 mm was prepared from an ingot synthesized by conventional synthesis method, namely, without controlling the shape of the synthesis face of the ingot in accordance with the method for measuring striae of optical glass specified in Standard 11 of Japan Optical Glass Industry Association, with both the sides of 50×20 mm subjected to parallel abrasion being parallel to the central axis of the ingot. The resulting sample was visually compared with the standard samples to find striae having a regular distribution in the form of convex in the direction of growing. The intensity of the striae was higher than the standard sample C of Standard 11 of Japan Optical Glass Industry Association (grade C or the third grade or less). The shape of the striae was curved face and curved 5 mm against the width 10 mm of the plane perpendicular to the optical axis (referred to as "5 mm/10 mm").

A columnar optical member having a diameter of 250 mm was obtained from this ingot. Optical lenses were prepared so that the striae of these optical member were nearly perpendicular to the optical axis, and an optical system was constructed using the lenses. The resulting resolution was low and the desired performance of optical design could not be satisfied.

EXAMPLE 6

A high purity synthetic silica glass ingot was prepared by so-called direct method which comprises burning oxygen gas and hydrogen gas by a multiple tube burner made of silica glass and jetting a starting material gas, namely, high purity silicon tetrachloride gas diluted with a carrier gas from the central part of the burner. The apparatus for producing synthetic silica glass is schematically shown in FIG. 5. The synthesis was carried out in the following manner. The target comprising an opaque silica glass plate on which silica glass powder is deposited was rotated at a given period and rocked in the direction of X axis and, simultaneously, was lowered in accordance with the deposition rate, thereby to keep the central position of the synthesis face of the ingot at the same distance from the burner. In addition to these movements, the temperature distribution at the synthesis face of the ingot was measured by ITV camera and the burner and the ingot were continuously moved on the X-Y plane so that the shape of the synthesis face became planar. Thus, the temperature distribution at the synthesis face of the ingot caused by the shape of the burner, amounts of various gases, etc. could be combined with the temperature distribution caused by the relative movement of the burner and the ingot, whereby uniformity of the refractive index of the resulting silica glass and the distribution of striae could be optimized.

The target was moved on the X-Y plane by the pattern as shown in column (B) of FIG. 11 according to which the retention time of the target increases with the center of the synthesis face of the ingot leaving the center of the burner. The shape of the synthesis face of the ingot was always monitored by ITV camera as mentioned above so that the shape of the synthesis face of the ingot was such that deviated from plane by ±1 mm/20 mm or less.

A measuring sample of 50×50×20 mm was prepared from the synthesized ingot in accordance with the method for measuring striae of optical glass specified in Standard 11 of Japan Optical Glass Industry Association, with both the sides of 50×20 mm subjected to parallel abrasion being horizontal to the synthesis face of the ingot. The resulting sample was visually compared with the standard samples to find no striae in the measuring direction.

Furthermore, a sample having parallel abraded sides perpendicular to the synthesis face of the ingot was prepared and similarly the measurement of striae was conducted to find that the regularity of the distribution of striae was not in the form of curved face (curved line), but in the form of a plane (straight line) perpendicular to the abraded face. The intensity of striae was similar to the standard sample B (grade B or second grade) of Standard 11 of Japan Optical Glass Industry Association.

Optical members were horizontally cut out from the ingot and lenses were prepared so that the striae were perpendicular to the optical axis as shown in FIG. 1A to FIG. 1C. An optical system was constructed using the lenses and it was confirmed that the optical system satisfied the desired performance of optical design.

EXAMPLE 7

A high purity synthetic silica glass ingot was prepared by so-called direct method. The synthesis was carried out with keeping the central position of the synthesis face of the ingot at the same distance from the burner by rotating the target comprising an opaque silica glass plate on which silica glass powder is deposited at a given period and, simultaneously, lowering the target in accordance with the deposition rate. In addition to these movements, the temperature distribution at the synthesis face of the ingot was measured by IR camera and the flow rates of oxygen gas and hydrogen gas to the central ring-like tube of the burner were changed depending on the resulting temperature distribution so that the temperature distribution at the synthesis face resulted in the shape of the synthesis face of the ingot as shown below. This is because increase of the gas flow rate results in concave central portion of the synthesis face and decrease results in convex central portion. Thus, the temperature distribution at the synthesis face of the ingot caused by the shape of the burner, amounts of various gases, etc. could be combined with the temperature distribution caused by the flow rate of the gas discharged from the burner, whereby uniformity of the refractive index of the resulting silica glass and the distribution of striae could be optimized.

The shape of the synthesis face of the ingot was always monitored by ITV camera as mentioned above, and by controlling the signal to a mass flow controller which controls the gas flow rate, the shape of the synthesis face of the ingot was made such that deviated from plane by ±1 mm/20 mm or less.

A measuring sample of 50×50×20 mm was prepared from the synthesized ingot in accordance with the method for measuring striae of optical glass specified in Standard 11 of Japan Optical Glass Industry Association, with both the sides of 50×20 mm subjected to parallel abrasion being horizontal to the synthesis face of the ingot. The resulting sample was visually compared with the standard samples to find no striae in the measuring direction.

Further, a sample having parallel abraded sides perpendicular to the synthesis face of the ingot was prepared and similarly the measurement of striae was conducted to find that the regularity of the distribution of striae was not in the form of a curved face (curved line), but in the form of a plane (straight line) perpendicular to the abraded face. The intensity of striae was similar to the standard sample B (grade B or second grade) of Standard 11 of Japan Optical Glass Industry Association.

Optical members were horizontally cut out from the ingot and lenses were prepared so that the striae were perpendicular to the optical axis. An optical system was constructed using the lenses and it was confirmed that the optical system satisfied the desired performance of optical design.

EXAMPLE 8

A measuring sample of 50×50×20 mm was prepared from an ingot synthesized by conventional synthesis method, namely, without controlling the shape of the synthesis face of the ingot in accordance with the method for measuring striae of optical glass specified in Standard 11 of Japan Optical Glass Industry Association, with both the sides of 50×20 mm subjected to parallel abrasion being parallel to the central axis of the ingot. The resulting sample was visually compared with the standard samples to find striae having a regular distribution in the form of a convex face in the growing direction.

A silica glass in the convex form corresponding to the distribution of striae was cut out from the ingot as shown in FIG. 2A to FIG. 2B and was deformed to a columnar form at high temperatures using the following heat treating apparatus.

The heat treating apparatus is shown in FIG. 9. This was an atmospheric heating furnace of double structure and partitioned by a muffle made of $Al_2O_3$. In this outer mold made of $Al_2O_3$ was filled a sol-gel synthetic silica powder as a matrix material. Thereafter, heat treatment was carried out at 1900° C. in an inert gas atmosphere to obtain a block of silica glass. This silica glass block was processed into a tube to make a silica matrix of 350 mm in outer diameter, 300 mm in inner diameter and 120 mm in thickness. A cylinder of 250 mm in diameter was cut out from inside of the matrix and was set inside a carbon outer mold.

The above-mentioned sample of 250 mm in diameter and 100 mm in thickness was placed in the heat treating apparatus. Silica plates were provided on upper and lower faces of the sample and the surface of the sample was completely covered and was heat treated in a heating furnace using a carbon heater and a carbon outer mold by heating in an inert gas atmosphere and under a pressure of 5.0 kg/cm² to 1900° C., keeping it at 1900° C. for 2 hours and then cooling at 50° C./hr.

As a result, a columnar optical member of 300 mm in diameter was obtained.

The striae were measured again to find that the shape of the striae was plane (straight line) which was deviated from plane by 1 mm/10 mm or less. The intensity of the striae was similar to standard sample B (grade B or second grade) of Standard 11 of Japan Optical Glass Industry Association.

Optical lenses were prepared so that the striae were perpendicular to the optical axis and an optical system was constructed using the lenses. It was confirmed that the optical system satisfied the desired performance of optical design.

As explained above, according to the present invention, it becomes possible to obtain a silica glass in which striae are parallel to each other and are planar or straight line, and optical members comprising the silica glass. When the optical members of the present invention are used in such a manner that the striae are perpendicular to the direction of using the lens (optical axis), it becomes possible to considerably improve the resolution of optical systems which use a light of specific wavelength region of 400 nm or less, preferably 300 nm or less in ultraviolet lithography technique.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.70165/1995 filed on Mar. 28, 1995 is hereby incorporated by reference.

What is claimed is:

1. A method for producing a silica glass for photolithography, which comprises the following steps:

jetting a starting material gas, an oxygen gas and a hydrogen gas from a burner and depositing and consolidating silica glass powder on a target to form an ingot having a growing direction, where the ingot is grown in such a manner that at least 50% of the total area of glass synthesis face on the ingot formed by depositing and consolidating the silica glass powder is a plane perpendicular to the growing direction of the ingot and has a curvature of the plane of 0.5 mm or less for the width of 10 mm, thereby to obtain the ingot having a portion in which striae are planes perpendicular to the growing direction of the ingot and have a curvature of the striae of 1 mm or less for the width of 10 mm; and cutting out of the ingot the portion in which the striae are planes perpendicular to the growing direction of the ingot, thereby to obtain a silica glass having striae which are parallel to each other and are planar.

2. A method according to claim 1, wherein the starting material gas, the oxygen gas and the hydrogen gas are jetted using a burner comprising a first tube which is arranged at the central portion of the burner and which is for jetting the starting material gas, a second tube which is arranged concentrically around the first tube and which is for jetting the oxygen gas, a third tube which is arranged concentrically around the second tube and which is for jetting the hydrogen gas, a fourth tube which is arranged concentrically around the third tube and which is for jetting the hydrogen gas, a plurality of fifth tubes which are arranged between the outer surface of the third tube and the inner surface of the fourth tube and which are for jetting the oxygen gas, a sixth tube which is arranged concentrically around the fourth tube and which is for jetting the hydrogen gas, and a plurality of seventh tubes which are arranged between the outer surface of the fourth tube and the inner surface of the sixth tube and which are for jetting the oxygen gas;

the flow velocity of the hydrogen gas jetted from the fourth tube and that of the oxygen gas jetted from the fifth tubes are smaller than the flow velocity of the hydrogen gas jetted from the third tube and that of the oxygen gas jetted from the second tube, respectively; and the flow velocity of the hydrogen gas jetted from the sixth tube and that of the oxygen gas jetted from the seventh tubes are smaller than the flow velocity of the hydrogen gas jetted from the fourth tube and that of the oxygen gas jetted from the fifth tubes, respectively.

3. A method according to claim 2, wherein the molar ratio of the oxygen gas jetted from the second tube to the hydrogen gas jetted from the third tube is 0.1–0.4; and the molar ratio of the oxygen gas jetted from the fifth tubes to that of the hydrogen gas jetted from the fourth tube and the molar ratio of the oxygen gas jetted from the seventh tubes to the hydrogen gas jetted from the sixth tube are 0.4–0.5, respectively.

4. A method according to claim 1, wherein the starting material gas, the oxygen gas and the hydrogen gas are jetted using a burner comprising a first tube which is arranged at the central portion of the burner and which is for jetting the starting material gas, a second tube which is arranged concentrically around the first tube and which is for jetting the hydrogen gas, a third tube which is arranged concentrically around the second tube and which is for jetting the oxygen gas, a fourth tube which is arranged concentrically around the third tube and which is for jetting the hydrogen gas, a plurality of fifth tubes which are arranged between the outer surface of the third tube and the inner surface of the fourth tube and which are for jetting the oxygen gas, a sixth tube which is arranged concentrically around the fourth tube and which is for jetting the hydrogen gas, and a plurality of seventh tubes which are arranged between the outer surface of the fourth tube and the inner surface of the sixth tube and which are for jetting the oxygen gas;

the flow velocity of the hydrogen gas jetted from the fourth tube and that of the oxygen gas jetted from the fifth tubes are smaller than the flow velocity of the hydrogen gas jetted from the second tube and that of the oxygen gas jetted from the third tube, respectively; and the flow velocity of the hydrogen gas jetted from the sixth tube and that of the oxygen gas jetted from the seventh tubes are smaller than the flow velocity of the hydrogen gas jetted from the fourth tube and that of the oxygen gas jetted from the fifth tubes, respectively.

5. A method according to claim 4, wherein the molar ratio of the oxygen gas jetted from the third tube to the hydrogen gas jetted from the second tube is 0.1–0.4; and the molar ratio of the oxygen gas jetted from the fifth tubes to that of the hydrogen gas jetted from the fourth tube and the molar ratio of the oxygen gas jetted from the seventh tubes to the hydrogen gas jetted from the sixth tube are 0.4–0.5, respectively.

6. A method according to claim 1, wherein the target and the ingot formed thereon are rocked in the direction of X axis substantially perpendicular to the growing direction of the ingot and rocked in the direction of Y axis substantially perpendicular to the growing direction of the ingot and the direction of the X axis to uniformly jet said gases to the glass synthesis face of the ingot; and with rotating the target and the ingot formed thereon around an ingot central axis parallel to the growing direction of the ingot, the target and the ingot are gradually left from the burner so that the distance between the burner and the glass synthesis face of the ingot is kept constant.

7. A method according to claim 6, wherein the intersection of the X axis and the Y axis is at a distance of 3–50 mm from the ingot central axis parallel to the growing direction of the ingot.

8. A method according to claim 1, wherein the ingot is grown in such a manner that at least 70% of the total area of glass synthesis face on the ingot formed by depositing and consolidating the silica glass powder is a plane substantially perpendicular to the growing direction of the ingot and has a curvature of the plane of 0.5 mm or less for the width of 10 mm.

\* \* \* \* \*